United States Patent
Lenox et al.

(10) Patent No.: US 7,136,151 B2
(45) Date of Patent: Nov. 14, 2006

(54) RETICLE GRIPPER BARRIER SYSTEM FOR LITHOGRAPHY USE

(75) Inventors: Richard Lenox, Trumbull, CT (US); Stephen Roux, New Fairfield, CT (US)

(73) Assignee: ASML Holding N.V., Veldhoven (NL)

( * ) Notice: Subject to any disclaimer, the term of this patent is extended or adjusted under 35 U.S.C. 154(b) by 188 days.

(21) Appl. No.: 10/901,188

(22) Filed: Jul. 29, 2004

(65) Prior Publication Data

US 2006/0023196 A1    Feb. 2, 2006

(51) Int. Cl.
*G03B 27/62*    (2006.01)
*G03F 9/00*    (2006.01)

(52) U.S. Cl. ............................................ 355/75; 430/5
(58) Field of Classification Search .................. 355/53, 355/51, 75; 430/5; 206/710
See application file for complete search history.

(56) References Cited

U.S. PATENT DOCUMENTS

| | | | |
|---|---|---|---|
| 6,216,873 B1 * | 4/2001 | Fosnight et al. ............ 206/710 |
| 6,239,863 B1 | 5/2001 | Catey et al. .................. 355/75 |
| 6,862,817 B1 | 3/2005 | Lenox .......................... 33/623 |
| 6,984,474 B1 * | 1/2006 | Roux et al. ..................... 430/5 |
| 2003/0218728 A1 * | 11/2003 | del Puerto et al. ............ 355/51 |

OTHER PUBLICATIONS

U.S. Appl. No. 10/628,326, filed Jul. 29, 2003, titled "Reticle Barrier System for Extreme Ultra-Violet Lithography."

* cited by examiner

*Primary Examiner*—Peter B. Kim
(74) *Attorney, Agent, or Firm*—Sterne, Kessler, Goldstein & Fox PLLC

(57) ABSTRACT

A reticle gripper barrier system for use in concert with a reticle gripper device that contacts a lithographic reticle is presented. In a particular embodiment, a reticle gripper barrier device includes a support plate affixed near or to the reticle gripper device and a gripper barrier or a set of concentric gripper barriers affixed to or near the support plate. A reticle gripper barrier system includes one or more reticle gripper barrier devices that form a complete or partial barrier around the point or points where the reticle gripper device contacts a lithographic reticle. The gripper barriers block contaminants and prevent them from migrating towards the mask and do not contact the lithographic reticle. The gripper barriers can be interleaved with corresponding contact barriers on a lithographic reticle, which the gripper device is contacting.

19 Claims, 15 Drawing Sheets

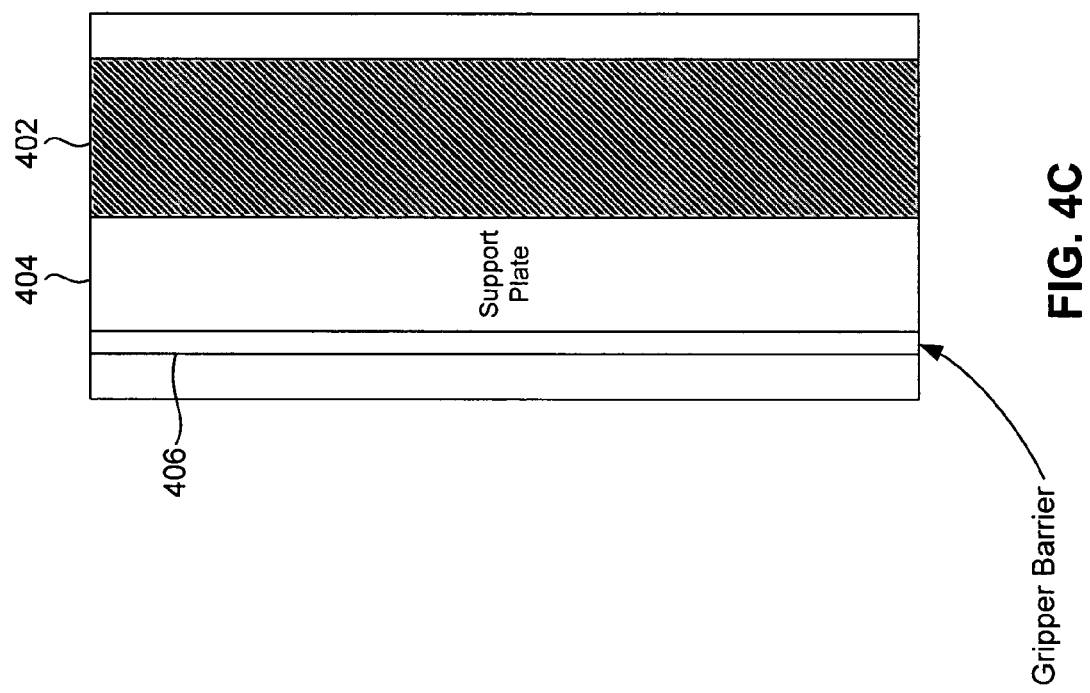

RETICLE GRIPPER BARRIER SYSTEM FOR LITHOGRAPHY USE

BACKGROUND OF THE INVENTION

1. Field of the Invention

The present invention relates to lithography, and more particularly, to reticle gripper devices used in lithography.

2. Background of Invention

Lithography is a process used to create features on the surface of substrates. Such substrates can include those used in the manufacture of flat panel displays, circuit boards, various integrated, circuits, and the like. A semiconductor wafer, for example, can be used as a substrate to fabricate an integrated circuit.

During lithography, a reticle is used to transfer a desired pattern onto a substrate. The reticle is formed of a material transparent to the lithographic wavelength being used, for example, glass in the case of visible light. In other systems, such as extreme ultra violet (EUV) lithography systems, a reflective mask can be used that reflects the lithographic wavelength being used. The reticle has an image printed on it, referred to as a mask. The size of the reticle is chosen for the specific system in which it is used. A reticle six inches by six inches and one-quarter inch thick may be used, for example. During lithography, a wafer, which is disposed on a wafer stage, is exposed to an image projected onto the surface of the wafer corresponding to the image printed on the reticle.

The projected image produces changes in the characteristics of a layer, such as a photoresist, deposited on the surface of the wafer. These changes correspond to the features projected onto the wafer during exposure. Subsequent to exposure, the layer can be etched, or otherwise processed, to produce a patterned layer. The pattern corresponds to those features projected onto the wafer during exposure. This patterned layer is then used to process exposed portions of underlying structural layers within the wafer, such as conductive, semiconductive, or insulative layers. This process is then repeated, together with other steps, until the desired features have been formed on the surface of the wafer.

As should be clear from the above discussion, the accurate location and size of features produced through lithography is directly related to the precision and accuracy of the image projected onto the wafer. In particular, the rigors of sub-100 nm lithography place stringent demands not only on the lithography tool, but also on the reticle. Airborne particles and dust that settle on the mask area of a reticle can cause defects on the wafer. Small image distortions or displacements in the reticle plane can swamp critical dimension and create overlay errors.

Many approaches have been developed to reduce airborne particles and dust that settle on a mask. In particular, extreme care is taken to ensure a clean environment around the mask. For example, in addition to clean room environments and operating within a vacuum, other steps are taken to minimize contaminants, such as reticles being typically transported mask side down to minimize the settling of debris on the mask. Another approach in conventional lithography is the use of a pellicle that provides a transparent screen above the surface of a mask to prevent particles from landing on a mask. Such an approach can not be effectively used in EUV lithographic systems. In EUV applications, a mask and/or contact barrier system, such as the ones described in commonly owned, copending U.S. patent application, Ser. No. 10/628,326, filed on Jul. 29, 2003, which is incorporated herein in its entirely, can be used to reduce the number of contaminants landing on the mask portion of a reticle.

These approaches reduce, but do not eliminate the number of contaminants landing on a mask. One of the primary sources of particle contaminants and debris is the stress of contact between a reticle gripping surface and a reticle. A reticle gripper device, such as the one described in co-pending, commonly owned U.S. patent application Ser. No. 10/704,900, filed Nov. 12, 2003, which is incorporated herein in its entirety by reference, includes reticle gripping surfaces that are used to position and hold a reticle in place. Reticle gripping surfaces will touch a reticle at one or more contact points on the reticle. When the reticle gripping surfaces contact the reticle, airborne contaminants can be generated.

What is needed is a reticle gripper barrier system that reduces contaminant scattering when a reticle gripping surface contacts a reticle.

SUMMARY OF THE INVENTION

The present invention is directed to a reticle gripper barrier device for use in concert with a reticle gripper device that contacts a lithographic reticle. In a particular embodiment, a reticle gripper barrier device includes a support plate affixed near or to the reticle gripper device and a gripper barrier affixed to the support plate. A reticle gripper barrier system includes one or more reticle gripper barrier devices that form a complete or partial barrier around the point or points where the reticle gripper device contacts a lithographic reticle. The gripper barrier contains contaminants from the contact points without contacting the lithographic reticle.

The gripper barriers have a discrete height to which they protrude from the inside plane of the support plates. The gripper barriers can also be shaped into different geometries, and arranged according to different configurations. In embodiments, the gripper barriers from a reticle gripper barrier device can be used individually or in groups, and can also be arranged to interleave their surfaces with contact or mask barriers on the surface of the lithography reticle.

There are numerous benefits associated with the use of a reticle gripper barrier system. First, the reticle gripper barrier system significantly reduces the number of contaminants landing on the surface of a mask, and therefore the quality of wafer images produced in a lithographic system can be greatly enhanced. Second, unlike pellicles, a reticle gripper barrier system can be used in EUV lithographic systems.

Further embodiments, features, and advantages of the invention, as well as the structure and operation of the various embodiments of the invention are described in detail below with reference to accompanying drawings.

BRIEF DESCRIPTION OF THE FIGURES

The invention is described with reference to the accompanying drawings. In the drawings, like duplicated reference numbers indicate identical or functionally similar elements. The drawing in which an element first appears is indicated by the left-most digit in the corresponding reference number.

FIG. 4C is a diagram of a reticle gripper device having a wedge shaped reticle gripping surface with a reticle gripper barrier device used in a horizontal position, according to an embodiment of the invention.

DETAILED DESCRIPTION OF THE INVENTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the invention would be of significant utility.

Figure 1:
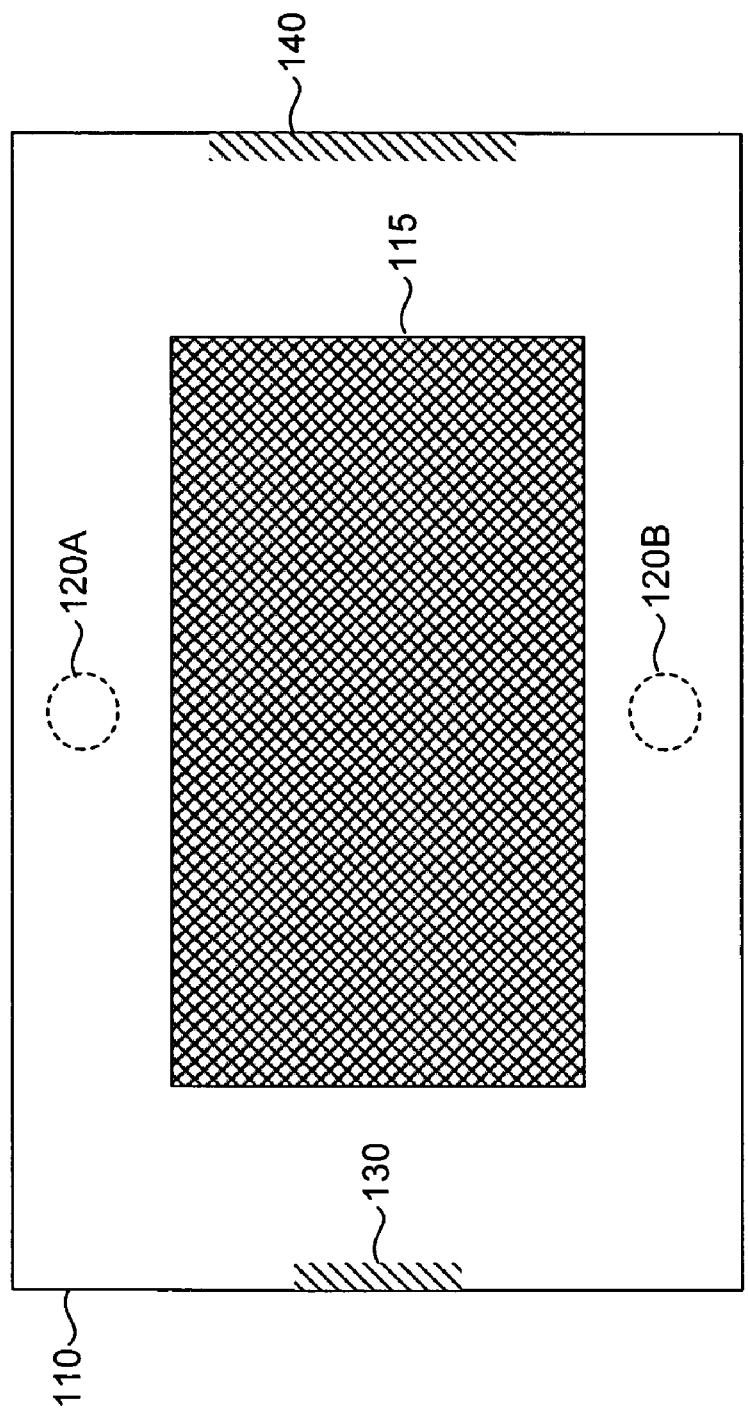
FIG. 1 is a diagram of a lithographic reticle having a mask.

FIG. 1 is a diagram of a lithographic reticle having a mask. Such an arrangement is commonly used in lithographic applications. The system includes reticle 110; mask 115; and contact spots 120A, 120B, 130 and 140. Contact spots 120A, 120B, 130 and 140 indicate locations on the reticle in which reticle gripping surfaces will contact the reticle to secure it in place for use. These locations are shown for illustration purposes only, and can be located at other regions of reticle 110.

Figure 2:
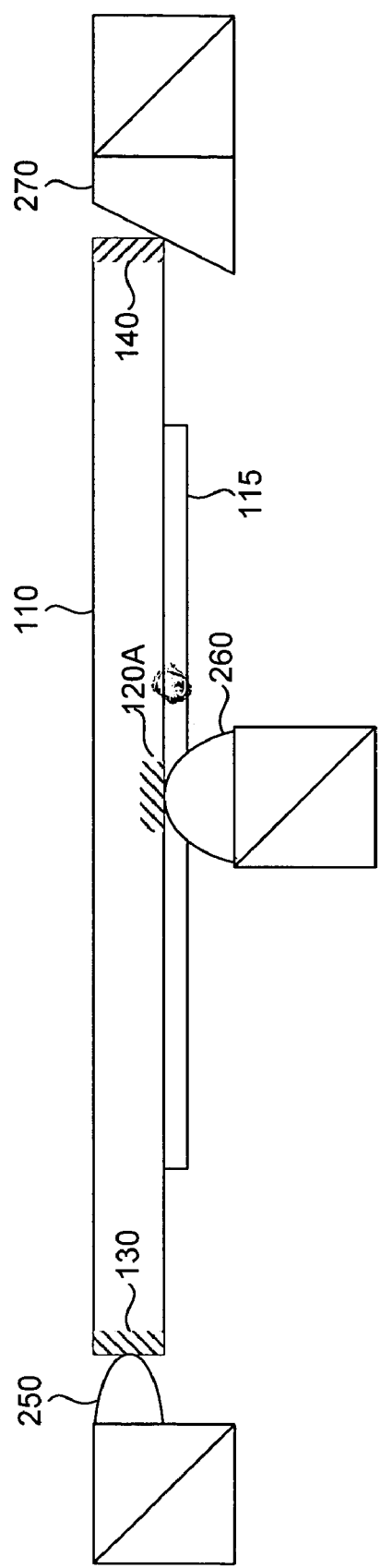
FIG. 2 is a diagram of a lithographic reticle having a mask and positioned in a reticle gripper device with multiple reticle gripping surfaces.

FIG. 2 is a diagram of lithographic reticle 110 with mask 115 held in place by a reticle gripper device having a series of reticle gripping surfaces. FIG. 2 illustrates a side view of reticle 110 in an inverted position with mask 115 facing downward, as is commonly the case. Specifically, three reticle gripping surfaces are shown. Reticle gripping surface 250 contacts reticle 110 at contact point 130. Reticle gripping surface 270 is located on an opposite edge from reticle gripping surface 250. Reticle gripping surface 270 includes a tapered surface that contacts reticle 110 at contact spot 140. Reticle gripping surface 250 provides a force on reticle 110 to secure it against reticle gripping surface 270 to provide horizontal stability.

Reticle gripping surface 260 is positioned under reticle 110, and provides a vertical force on reticle 110 at contact point 120A to support reticle 110 vertically. A similar reticle gripping surface would exist under contact spot 120B (as shown in FIG. 1, but not shown in FIG. 2.) Reticle gripping surface 270 provides a force on reticle 110 to secure it with vertical stability together with reticle gripping surface 260.

Many types of reticle gripper devices with reticle gripping surfaces at various locations can be used within lithography devices, as will be known by individuals skilled in the relevant arts. The location, configuration and design of reticle gripping surfaces 250, 260, and 270 are illustrative and not intended to limit the scope of the invention. Additional example reticle gripping surfaces are shown in co-pending, commonly owned U.S. patent application Ser. No. 10/704,900, filed Nov. 12, 2003, which is incorporated herein in its entirety by reference.

Figure 3:
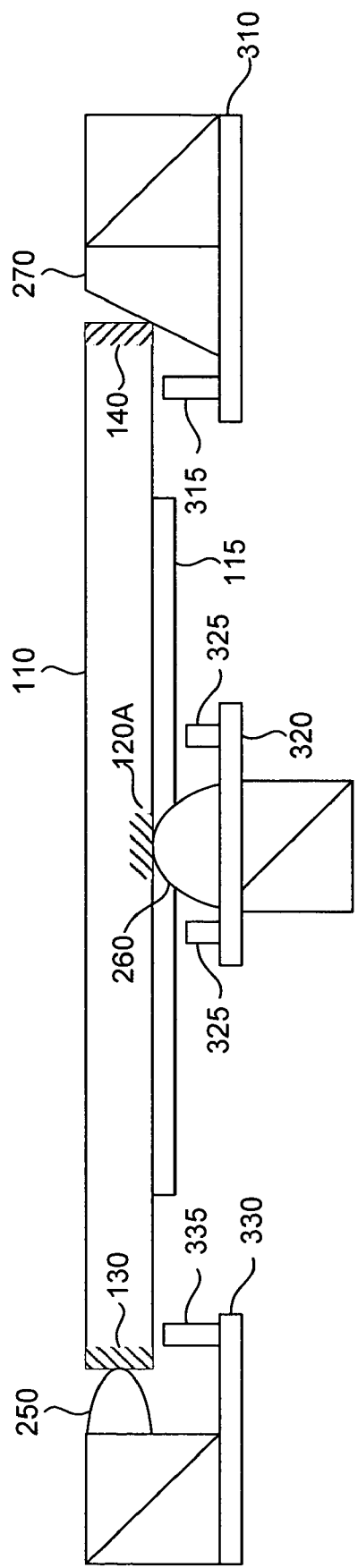
FIG. 3 is a diagram of a lithographic reticle having a mask and positioned in a reticle gripper device, which has a reticle gripper barrier system, according to an embodiment of the invention.

FIG. 3 is a diagram of lithographic reticle 110 having mask 115 positioned in reticle gripping surfaces 250, 260, and 270 with reticle gripper barrier devices, according to an embodiment of the invention. Each reticle gripping surface 250, 260 and 270 has a reticle gripper barrier device affixed to or near it. Each reticle gripper barrier device includes a support plate and a gripper barrier. Specifically, support plate 330 and gripper barrier 335 are affixed below reticle gripper device 250. Support plate 320 and reticle gripper barrier 325 are affixed to reticle gripping surface 260. Support plate 310 and gripper barrier 315 are affixed to reticle gripping surface 270.

In general, reticle barrier systems involve a configuration of reticle barrier devices which involve support plates, such as support plates 310, 320 and 330, that affix to reticle gripping surfaces and gripper barriers, such as gripper barrier 315, 325, and 335, which each form a contaminant barrier between a contact spot and a mask. In alternative embodiments, support plates can affix near, instead of to, a reticle gripping surface. Gripper barriers are positioned, shaped and sized with respect to the location and shape of the reticle contact points of their respective reticle gripping surfaces. Their heights must be sufficiently sized to bring the top of each barrier as close as possible to the masked side of a reticle, but without ever touching the reticle.

Figure 4A:
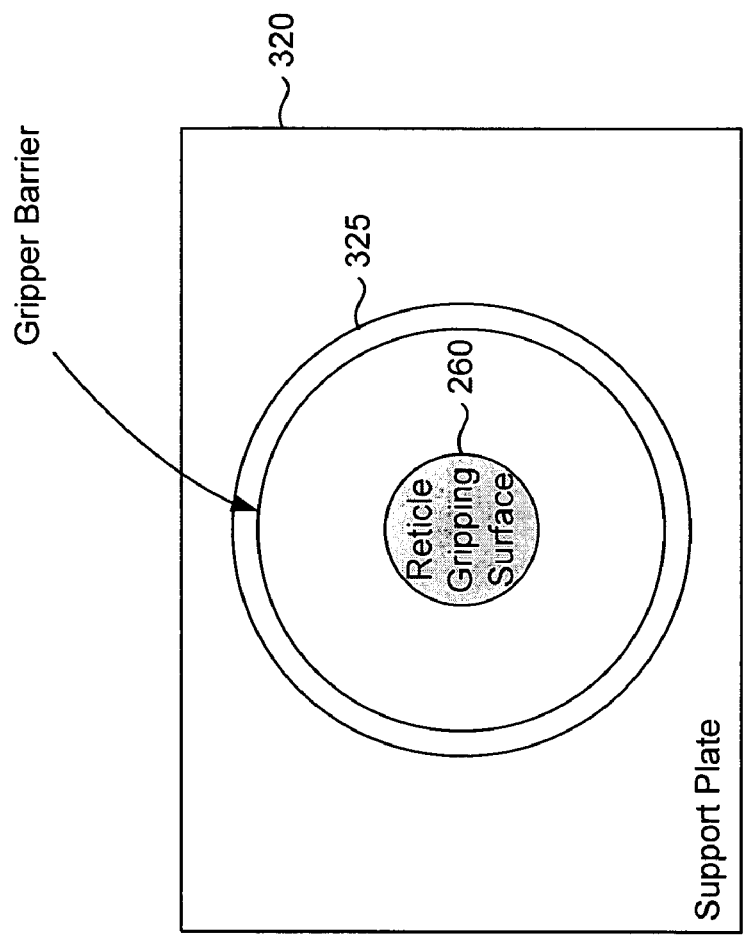
FIG. 4A is a diagram of a reticle gripper device having a spherical reticle gripping surface with a reticle gripper barrier device used in a vertical position, according to an embodiment of the invention.

FIG. 4A is a diagram of reticle gripping surface 260 with a reticle barrier device, according to an embodiment of the invention. FIG. 4A provides a top down view of reticle gripping surface 260 with reticle 110 not shown for ease of illustration. Reticle gripping surface 260 would contact reticle 110 at contact spot 120A. FIG. 4A illustrates that gripper barrier 325 surrounds reticle gripping surface 260, thereby forming a barrier completely around a contact point, such as contact point 120A. By establishing a contaminant barrier around a contact point, the majority of debris from the contact point will impinge upon contact barrier 325 and not on mask 115. In other embodiments, gripper barrier 325 can form a barrier partially around a contact point to block contaminants from a mask.

Figure 4B:
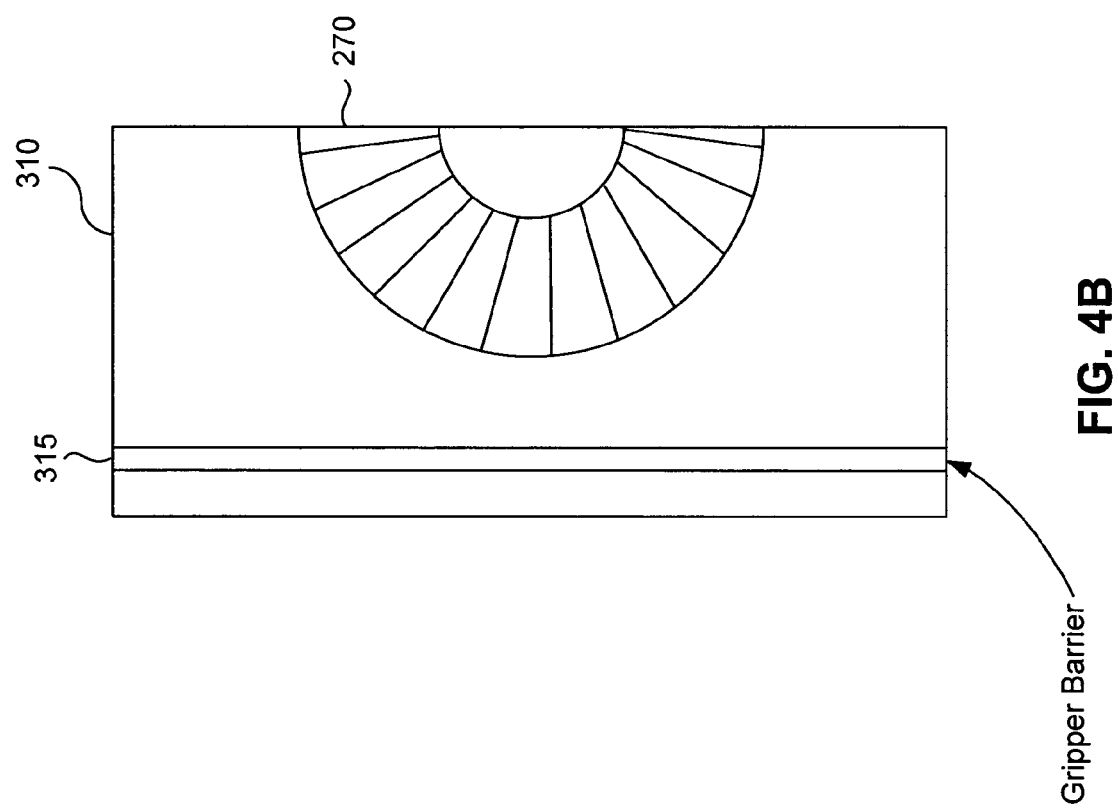
FIG. 4B is a diagram of a reticle gripper device having a truncated conical-shaped reticle gripping surface with a reticle gripper barrier device used in a horizontal position, according to an embodiment of the invention.

FIG. 4B is a diagram of reticle gripping surface 270 with a reticle barrier device, according to an embodiment of the invention. FIG. 4B provides a top down view of reticle gripping surface 270 with reticle 110 not shown for ease of illustration. As shown in FIG. 3, reticle gripping surface 270 contacts reticle 110 at contact spot 140. Reticle gripping surface 270 has the shape of a truncated cone that only spans a portion of the width of support plate 310. FIG. 4B illustrates that gripper barrier 315 runs completely between mask 115 and reticle gripping surface 270, thereby forming a particle barrier between contact spot 140 and mask 115. By establishing a contaminant barrier, the majority of debris from contact spot 140 will impinge upon gripper barrier 315 and not on mask 115.

Figure 4D:
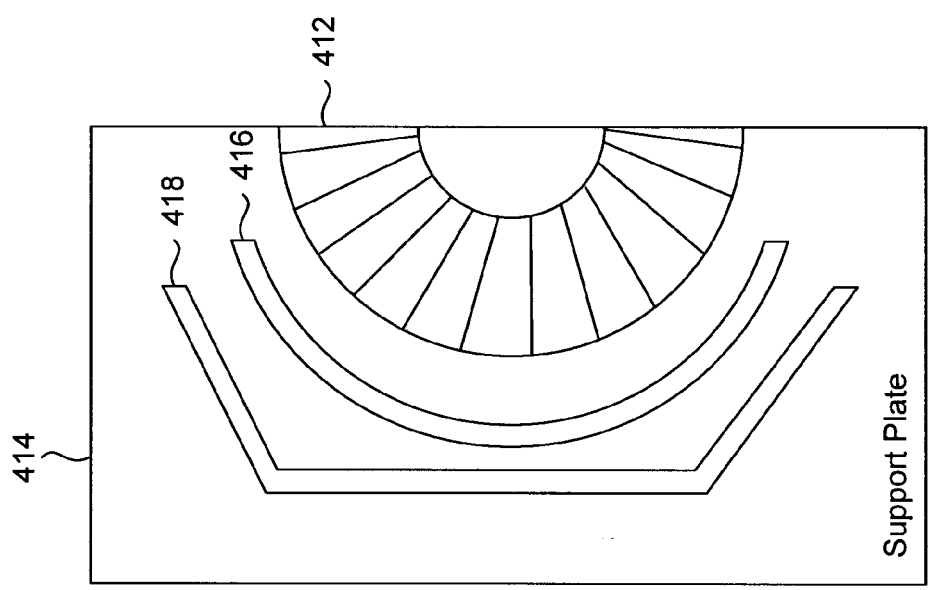
FIG. 4D is a diagram of a reticle gripper device having a truncated conical-shaped reticle gripping surface with a reticle gripper barrier device having two gripper barriers used in a horizontal position, according to an embodiment of the invention.

FIGS. 4C and 4D show alternative arrangements of types of reticle barrier devices and reticle gripping surfaces for those depicted in FIG. 4B. FIG. 4C is a diagram of reticle gripping surface 402 with a reticle barrier device, according to an embodiment of the invention. FIG. 4C provides a top down view of reticle gripping surface 402 with reticle 110 not shown for ease of illustration. The reticle barrier device includes support plate 404 and gripper barrier 406. In this case, reticle gripping surface 402 is a wedge that runs the length of support plate 404. As in the case of reticle gripping surface 270, reticle gripping surface 402 contacts reticle 110 at a contact spot.

FIG. 4C illustrates that gripper barrier 406 runs completely between mask 115 and reticle gripper surface 402, thereby forming a particle barrier between a contact spot and a mask, such as mask 115. By establishing a contaminant barrier, the majority of debris from a contact spot will impinge upon gripper barrier 406 and not on a mask, such as mask 115.

FIG. 4D is a diagram of reticle gripping surface 412 with a reticle barrier device, according to an embodiment of the invention. FIG. 4D provides a top down view of reticle gripping surface 412 with reticle 110 not shown for ease of illustration. The reticle barrier device includes support plate 414, gripper barrier 416 and gripper barrier 418. As in the case of reticle gripping surface 270, reticle gripping surface 412 contacts reticle 110 at a contact spot. Reticle gripping surface 412 has the shape of a truncated cone that only spans a portion of the width of support plate 414.

FIG. 4D illustrates that the reticle gripper device has two concentric gripper barriers. Gripper barrier 416 forms a semicircular barrier around reticle gripping surface 412. Gripper barrier 418, in turn, forms a second barrier concentric to gripper barrier 416. Three rectangular shaped segments are connected to form gripper barrier 418. Gripper barrier 416 and 418 form two particle barriers between a contact spot and a mask, such as mask 115. By establishing a contaminant barrier, the majority of debris from contact point will impinge upon gripper barriers 416 and 418 and not on mask 115.

Figure 4E:
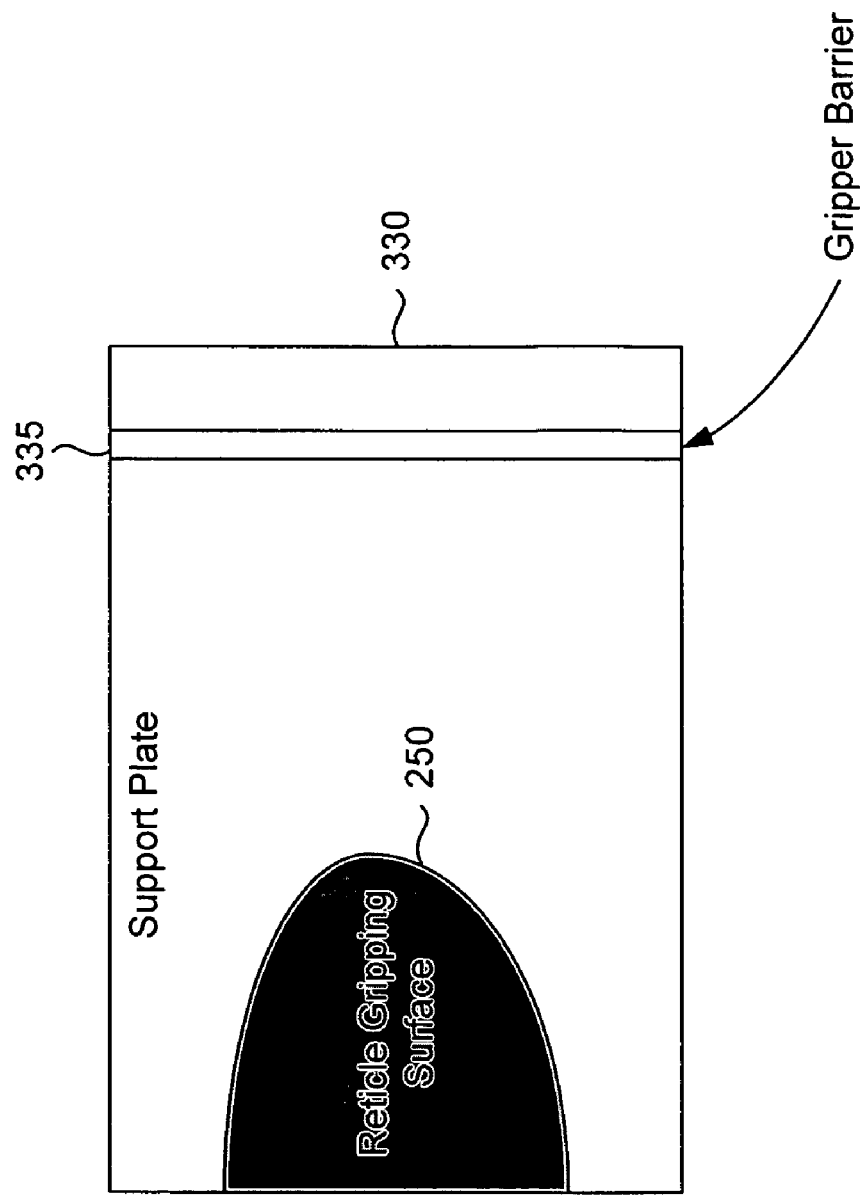
FIG. 4E is a diagram of a reticle gripper device having a spherical reticle gripping surface with a reticle gripper barrier device used in a horizontal position, according to an embodiment of the invention.

FIG. 4E is a diagram of reticle gripping surface 250 with a reticle barrier device, according to an embodiment of the invention. FIG. 4E provides a top down view of reticle gripping surface 250 with reticle 110 not shown for ease of illustration. Reticle gripping surface 250 contacts reticle 110 at contact spot 130. FIG. 4C illustrates that gripper barrier 335 is located between reticle gripping surface 250 and mask 115, thereby forming a barrier between a contact point, such as contact point 130, and a mask, such as mask 115. By establishing a contaminant barrier, the majority of debris from contact point 130 will impinge upon gripper barrier 315 and not on mask 115.

Figure 4F:
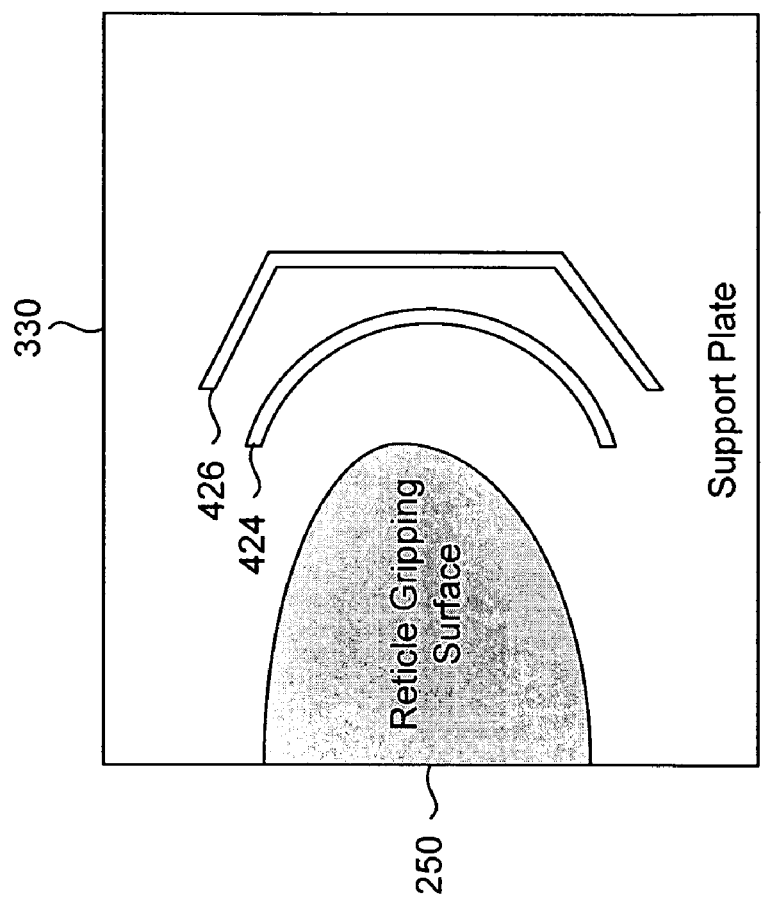
FIG. 4F is a diagram of a reticle gripper device having a spherical reticle gripping surface with a reticle gripper barrier device having two gripper barriers used in a horizontal position, according to an embodiment of the invention.
Figure 4G:
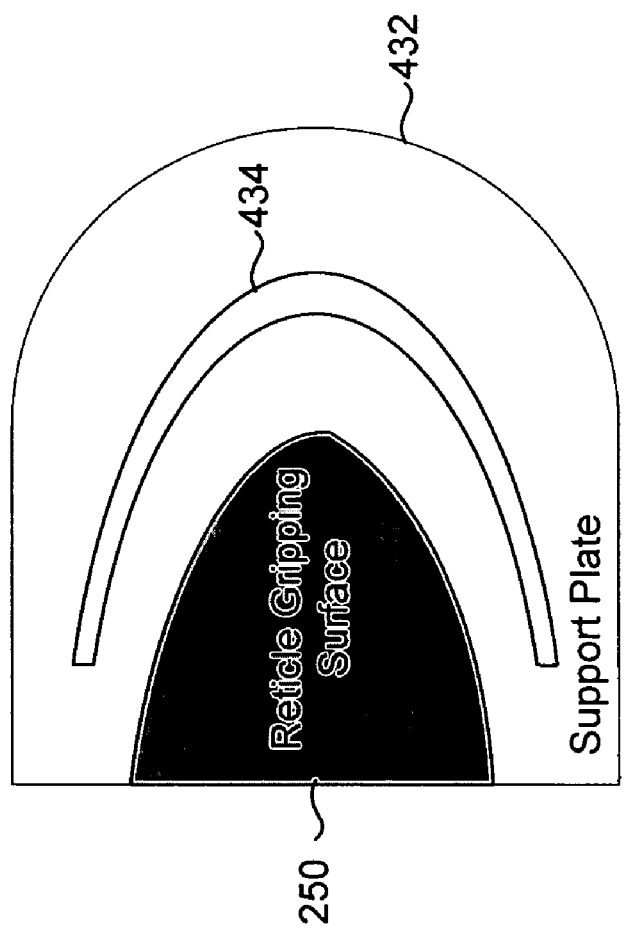
FIG. 4G is a diagram of a reticle gripper device having a spherical reticle gripping surface with a reticle gripper barrier device having a semicircular support plate and semicircular gripper barrier used in a horizontal position, according to an embodiment of the invention.

FIGS. 4F and 4G show alternative arrangements of types of reticle barrier devices for use with reticle gripping surface 250. FIG. 4F is a diagram of reticle gripping surface 250 with a reticle gripper barrier device, according to an embodiment of the invention. FIG. 4F provides a top down view of reticle gripping surface 250 with reticle 110 not shown for ease of illustration. The reticle barrier device includes support plate 330, gripper barrier 424 and gripper barrier 426. Reticle gripping surface 250 contacts reticle 110 at a contact spot 130.

FIG. 4F illustrates that the reticle gripper device has two concentric gripper barriers. Gripper barrier 424 forms a semicircular barrier around reticle gripping surface 250. Gripper barrier 426, in turn, forms a second barrier concentric to gripper barrier 426. Three rectangular shaped segments are connected to form gripper barrier 426. Gripper barrier 424 and 426 form two particle barriers between contact point 130 and a mask, such as mask 115. By establishing a contaminant barrier, the majority of debris from contact point will impinge upon gripper barrier 424 and 426 and not on mask 115.

FIG. 4G provides a top down view of reticle gripping surface 250 with reticle 110 not shown for ease of illustration. The reticle barrier device includes support plate 432 and gripper barrier 434. FIG. 4G illustrates that support plate 432 is a semicircular plate. Gripper barrier 434 mounts on support plate 432 and forms a semicircular barrier around reticle gripping surface 250 to form a particle barrier between a contact spot 130 and a mask, such as mask 115. By establishing a contaminant barrier, the majority of debris from contact spot 130 will impinge upon gripper barrier 434 and not on mask 115.

In alternative embodiments, gripper barriers, such as those depicted in FIGS. 4A–4G can be any geometric shape (e.g., square, rectangle, triangle that surrounds a reticle gripping surface) Additionally, in other embodiments, gripper barriers can be other partial geometric shapes (e.g., half of a square) positioned in such a way to provide a contaminant barrier between a reticle gripping surface and a mask, but that does not completely encircle a reticle gripping surface. In other embodiments, a gripper barrier can be non-contiguous, that is, instead of entailing only one geometric shape or maintaining one continuous line of varying shape, a gripper barrier can include a series of segmented barriers, which collectively form a gripper barrier. Similarly, the size and shape of a support plate can be varied to meet lithographic tool design requirements as well as those of gripper barriers. A support plate can be, for example, a circle, square, or triangle provided that a gripper barrier can be positioned inside the outer boundaries of a support plate.

Support plates and gripper barriers can be any material that is suitable for use in the particular lithographic environment. For example, in EUV lithography the materials should be suitable for an extreme ultraviolet environment in vacuum conditions. Examples of these materials include, but are not limited to, aluminum, other types of metals, and ceramics.

Gripper barriers typically range in height depending on the size of the reticle gripping surface and can be several millimeters in width. The specific dimensions of gripper barriers are design factors, which will be influenced by the specific application, clearances within the reticle area, and environment compatibility.

The use of gripper barriers runs counter to traditional means, such as the use of a pellicle, to prevent contaminants from landing on the surface of a mask. An examination of contaminant characteristics within an ultraviolet lithographic system in the area of the reticle demonstrates that contaminants typically have low energy and often originate at contact spots on the reticle that are used for moving and holding the reticle in position. Given the low energy of the contaminants, upon colliding with a gripper barrier, the contaminants come to rest on the gripper barrier. Furthermore, while some contaminants will move away from contact spots or other points on the reticle with trajectories that would take them past or around a gripper barrier, many will not have the energy to sustain the trajectory to reach a mask. Thus, gripper barriers will prevent many contaminants, but not all, from landing on the surface of a mask, such as mask 115.

FIGS. 4A–4G provide example configurations for support plates and gripper barriers. These examples are not intended to limit the invention. The scope of the invention extends to any reticle gripper barrier device that provides a gripper barrier either completely or partially surrounding a reticle gripping surface to reduce the amount of debris that may land on a mask when a reticle gripping surface comes in contact with a reticle. Additionally, when a frame is used to hold a reticle in place, similar reticle gripper barrier devices can be used in a way that will be known by individuals skilled in the art based on the teachings herein.

Figure 5A:
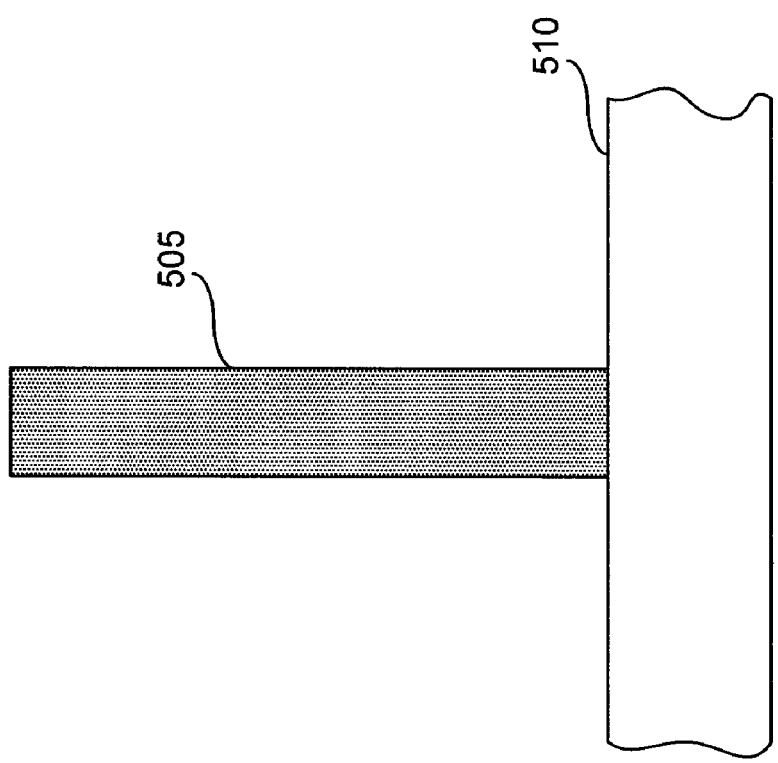
FIG. 5A is a diagram of a cross sectional view of a gripper barrier, according to an embodiment of the invention.
Figure 5B:
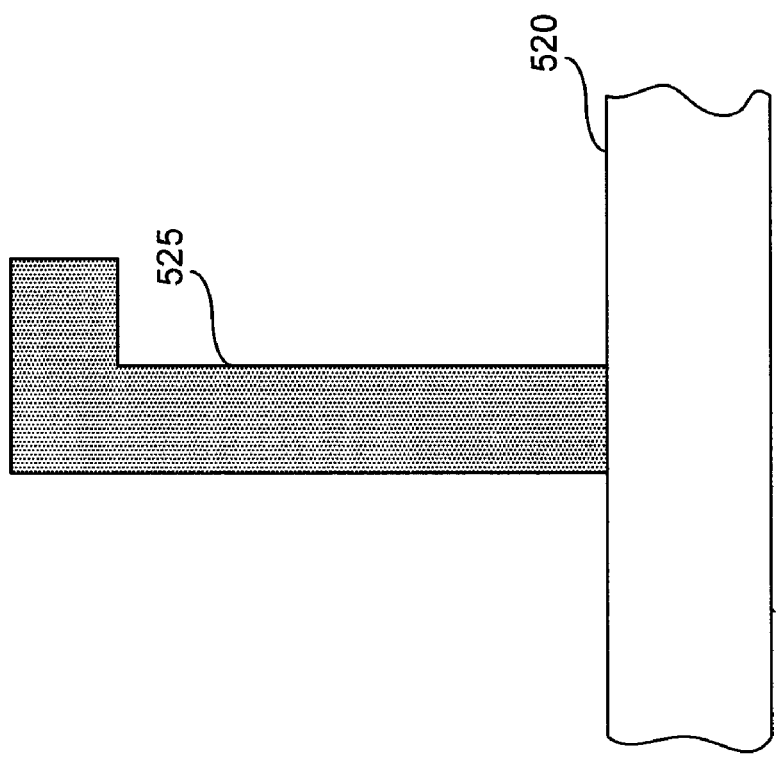
FIG. 5B is a diagram of a cross sectional view of a gripper barrier with a right angle flange, according to an embodiment of the invention.
Figure 5C:
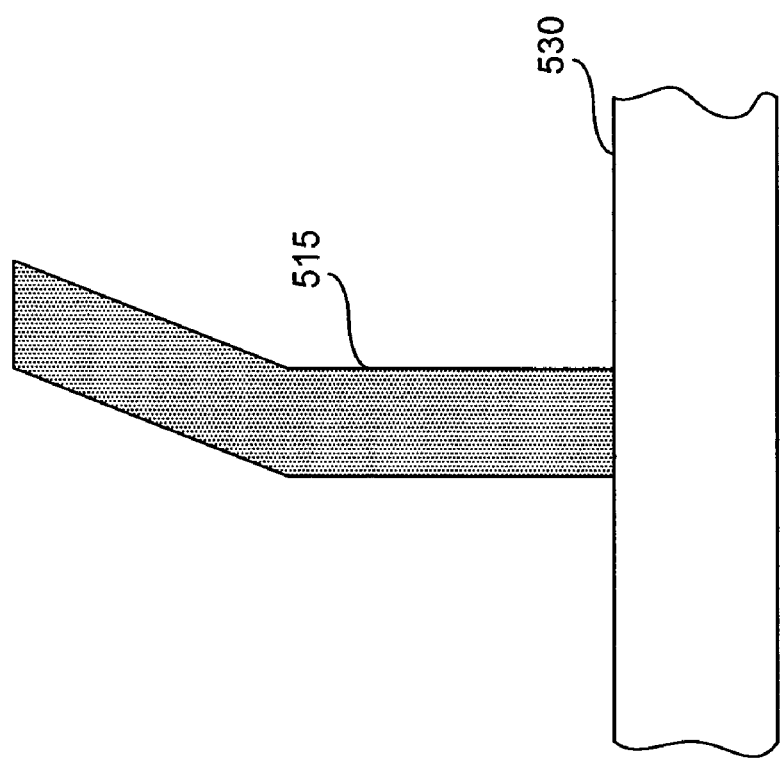
FIG. 5C is a diagram of a cross sectional view of a gripper barrier with an angled flange, according to an embodiment of the invention.

FIGS. 5A, 5B, and 5C illustrate three different shapes for a gripper barrier. These shapes are not inclusive of all shapes, but are illustrative of possible variations. Based on the teachings herein, a person skilled in the relevant art will be able to identify additional shapes. FIG. 5A is a diagram of a cross sectional view of a gripper barrier, according to an embodiment of the invention. In FIG. 5A, gripper barrier 505 is affixed to support plate 510. In this embodiment, gripper barrier 505 forms a rectangular cross section that extends substantially perpendicular to support plate 510.

In FIG. 5B, gripper barrier 525 is affixed to support plate 520. In this embodiment, gripper barrier 525 has a height relative to support plate 520 with a flange that extends from gripper barrier 525 in a substantially parallel direction to the plane of support plate 520 inward toward a reticle gripping surface.

In FIG. 5C, gripper barrier 515 is affixed to support plate 530. In this embodiment, gripper barrier 515 has a height relative to support plate 520 with a flange that extends from gripper barrier 515 at an angle greater than ninety degrees measured relative to a vertical portion of gripper barrier 515, extending away from the reticle gripping surface.

Figure 6:
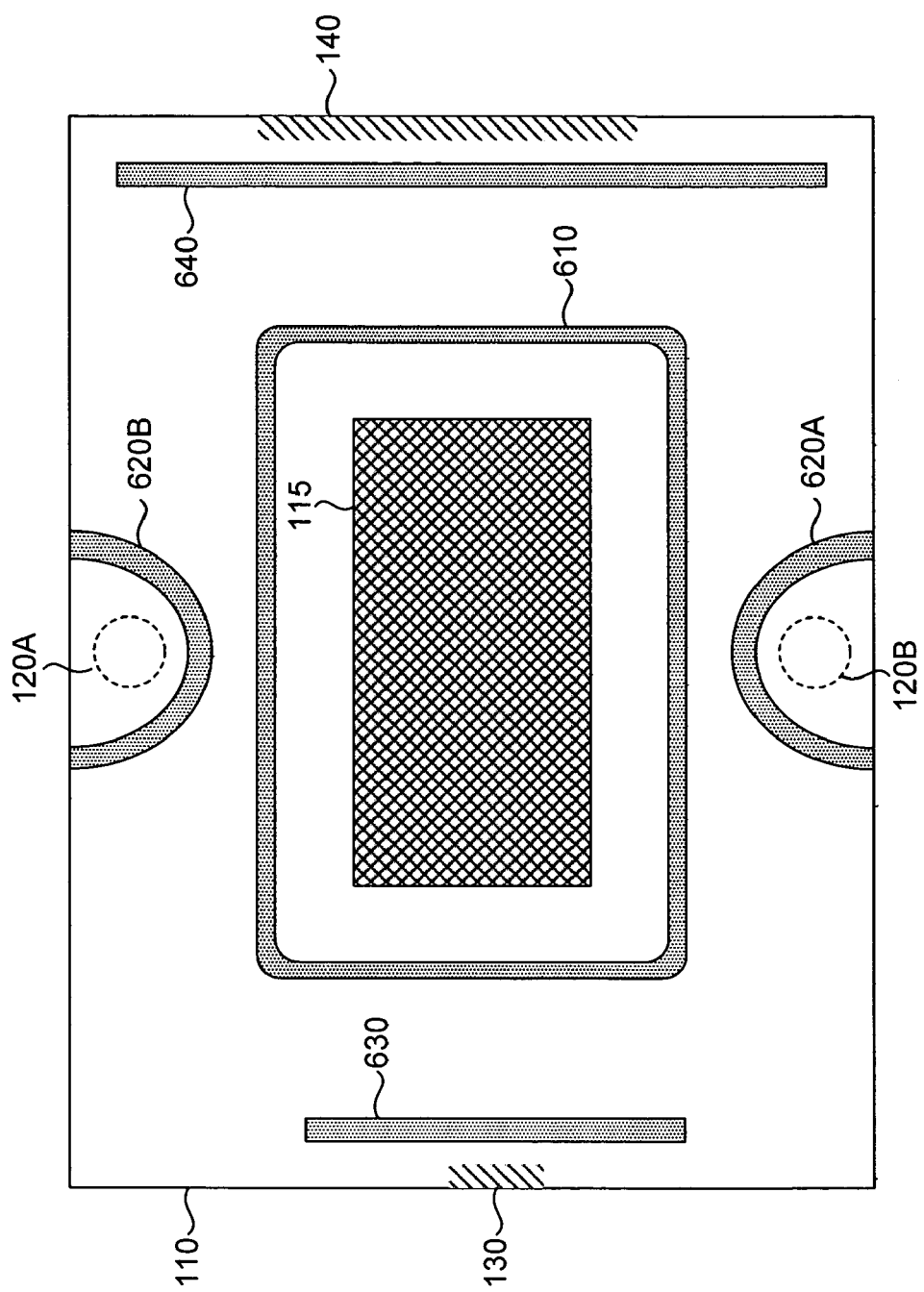
FIG. 6 is a diagram of a lithographic reticle having a mask with mask and contact barriers.

FIG. 6 is a diagram of lithographic reticle 110 having mask 115 with mask and contact barriers. Such a system is described in commonly owned, copending U.S. patent application Ser. No. 10/628,326, filed on Jul. 29, 2003. The system includes: reticle 110; mask 115; contact spots, such as contact spots 120A, 120B, 130 and 140; mask barrier 610 and contact barriers, such as contact barriers 620A, 620B, 630 and 640. Mask barrier 610 surrounds mask 115 and reduces the number of contaminants that can land on the mask surface. Mask barrier 610 achieves this objective by blocking the trajectory path of many contaminants that may originate, for example, at contact spots. Mask barrier 610 typically can range in height from two to ten millimeters in height and several millimeters in width.

Additionally, contact barriers 620A, 620B, 630 and 640 can be used to reduce the number of contaminants that can land on the mask surface. A contact barrier, such as contact barriers 620A, 620B, 630, and 640 is affixed between mask 115 and a corresponding contact spot, such as contact spots 120A, 120B, 130 and 140. As in the case of mask barrier 610, contact barriers block the trajectory path of many contaminants. In particular, contact barriers, such as contact barrier 620A block contaminants that originate at contact spots, such as contact spot 120A. As indicated above, the majority of contaminants originate at the contact spots. Contact barriers typically can range in height from two to ten millimeters in height and several millimeters in width.

The system depicted in FIG. 6 provides an effective alternative means to reduce the number of contaminants that can land on mask 115. The reticle barrier system of the present invention can be used with the mask and contact barriers described in FIG. 6 to further reduce the number of contaminants that can land on mask 115.

Figure 7:
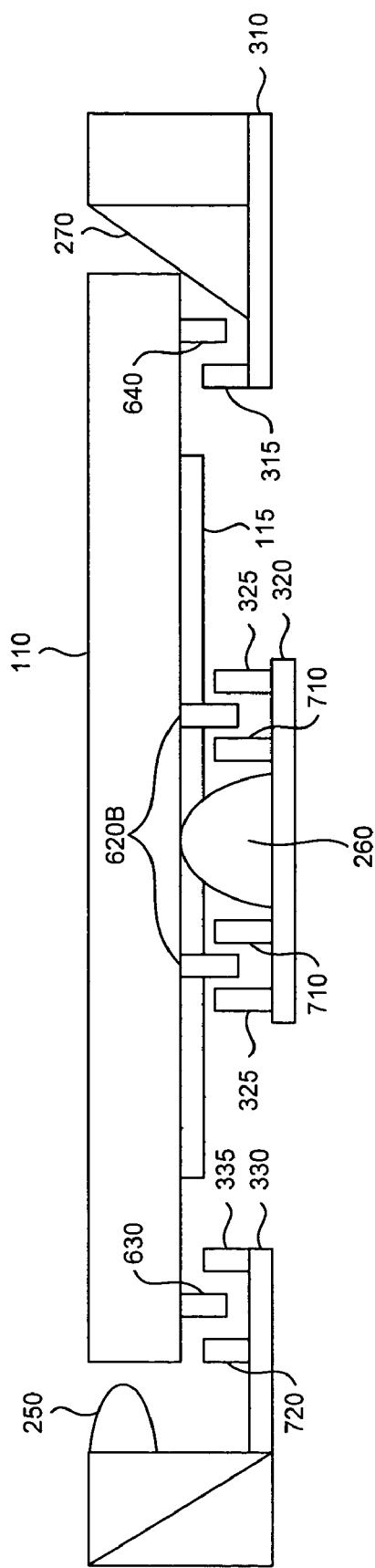
FIG. 7 is a diagram of a lithographic reticle having a mask with mask and contact barriers placed in a reticle gripping device having different types of gripping surfaces and reticle gripper barriers, according to an embodiment of the invention.

FIG. 7 is a diagram of lithographic reticle 110 having mask 115 with gripper, mask, and contact barriers, according to an embodiment of the invention. The system depicted in FIG. 7 includes reticle 110; mask 115; contact barriers 620B, 630, and 640; reticle gripping surfaces 250, 260 and 270; support plates 310, 320, and 330; and gripper barriers 315, 325, 335, 710 and 720.

Contact barrier 620B provides a contact barrier around a point where reticle gripping surface 260 contacts reticle 110. Support plate 320 is affixed to reticle gripping surface 260. Gripper barriers 710 and 325 form concentric gripper barriers around reticle gripping surface 260. When reticle gripping surface 260 is moved into place, gripper barriers 710 and 325 are interleaved with contact barrier 620B. Such that when moving outward from the point where reticle gripping surface 260 contacts reticle 110, a contaminant would need to travel past gripper barrier 710, contact barrier 620B, and gripper barrier 325. Gripper barrier 710 and 325 would be close to, but not touching contact barrier 620B. In an alternative embodiment, gripper barrier 710 is not present. In this case gripper barrier 325 and contact barrier 620B can be interleaved with gripper barrier 325 being either the inner or outer barrier relative to reticle gripping surface 260.

Contact barrier 630 provides a contact barrier around the point where reticle gripping surface 250 contacts reticle 110. Support plate 330 is affixed to reticle gripping surface 250. Gripper barriers 330 and 720 form concentric gripper barriers around reticle gripping surface 250. When reticle gripping surface 250 is moved into place, gripper barriers 330 and 720 are interleaved with contact barrier 630, such that when moving inward toward mask 115 from the point where reticle gripping surface 250 contacts reticle 110, a contaminant would need to travel a tortuous path past gripper barrier 720, contact barrier 630, and gripper barrier 330. Gripper barrier 330 and 720 would be close to, but not touching contact barrier 630. In an alternative embodiment, gripper barrier 720 is not present. In this case gripper barrier 330 and contact barrier 630 can be interleaved with gripper barrier 330 being either the inner or outer barrier relative to reticle gripping surface 250.

Contact barrier 640 provides a contact barrier around the point where reticle gripping surface 270 contacts reticle 110. Support plate 310 is affixed to reticle gripping surface 270. Gripper barrier 315 forms a barrier around reticle gripping surface 270. When reticle gripping surface 270 is moved into place, gripper barrier 315 is interleaved with contact barrier 640. Such that when moving outward from the point where reticle gripping surface 270 contacts reticle 110 toward mask 115, a contaminant would need to travel a tortuous path past contact barrier 640, and gripper barrier 315. Gripper barrier 315 would be close to, but not touching contact barrier 640

CONCLUSION

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

What is claimed is:

1. A reticle gripper barrier device for use with a reticle gripping device having at least one reticle gripping surface that touches a lithographic reticle having a mask formed on a front surface thereof, comprising:
a support plate affixed near a reticle gripping surface; and
a gripper barrier affixed to said support plate that forms a barrier around a point or points where the reticle gripping surface touches the lithographic reticle, wherein said gripper barrier blocks contaminants from the mask and does not contact the lithographic reticle.

2. The reticle gripper barrier device of claim 1,
wherein said gripper barrier can be interleaved with a contact barrier affixed to a reticle,
wherein said gripper barrier is concentric with the inner side of said contact barrier.

3. The reticle gripper barrier device of claim 1,
wherein said gripper barrier can be interleaved with a contact barrier affixed to a reticle,
wherein said gripper barrier is concentric with the outer side of said contact barrier.

4. The reticle gripper barrier device of claim 1, wherein a flange extends from the gripper barrier at a height relative to said support plate, but not extending to the front surface of the reticle.

5. The reticle gripper barrier device of claim 4, wherein said flange extends away from the mask and substantially parallel to a plane in which the mask lies.

6. The reticle gripper barrier device of claim 4, wherein said flange extends away from the mask and at an angle greater than ninety degrees measured relative to a vertical portion of the reticle gripper barrier device that is substantially perpendicular to a plane of the mask.

7. The reticle gripper barrier device of claim 1, wherein said reticle gripper barrier device is formed of materials that are compatible with extreme ultra violet radiation and vacuum conditions.

8. The reticle gripper barrier device of claim 1, wherein said reticle gripper barrier device is aluminum.

9. The reticle gripper barrier device of claim 1, wherein said reticle gripper barrier device is ceramic.

10. The reticle gripper barrier device of claim 1, wherein said support plate is affixed to the reticle gripper device.

11. A reticle gripper barrier device for use with a reticle gripping device having a reticle gripping surface that touches a lithographic reticle having a mask formed on a front surface thereof, comprising:
a support plate affixed near the reticle gripping device;
a first gripper barrier affixed to said support plate; and
a second gripper barrier affixed to said support plate, wherein first and second gripper barriers form concentric barriers around a point or points where the reticle gripping surface touches the lithographic reticle to block contaminants from the mask, and wherein said first and second gripper barriers do not contact the lithographic reticle.

12. The reticle gripper barrier device of claim 11, wherein said first and second gripper barriers can be interleaved with a contact barrier affixed to a reticle.

13. The reticle gripper barrier device of claim 11, wherein said reticle gripper barrier device is formed of materials that are compatible with extreme ultra violet radiation and vacuum conditions.

14. The reticle gripper barrier device of claim 11, wherein said support plate is affixed to the reticle gripping device.

15. A reticle gripper device for use in gripping a lithographic reticle having a mask formed on a front surface thereof, comprising:
a reticle gripping surface for touching the lithographic reticle; and
a reticle gripper barrier device affixed to said reticle gripping device that forms a barrier around points where said reticle gripping surface contacts the lithographic reticle to block contaminants from the mask; wherein said gripper barrier does not contact the lithographic reticle.

16. The reticle gripper device of claim 15, wherein said reticle gripper barrier device comprises:
a support plate affixed to the reticle gripping device; and
a gripper barrier affixed to said support plate that forms a barrier around a point or points where the reticle gripping surface touches the lithographic reticle, wherein said gripper barrier blocks contaminants from the mask and does not contact the lithographic reticle.

17. The reticle gripper device of claim 15, wherein said reticle gripper barrier device is formed of materials that are compatible with extreme ultra violet radiation and vacuum conditions.

18. A reticle gripper barrier system for use with a reticle gripping device having more than one reticle gripping surfaces that touch a lithographic reticle having a mask formed on a front surface thereof, comprising:
a plurality of reticle gripper barrier devices, wherein each of said plurality of reticle gripper barrier devices comprises
a support plate affixed near a reticle gripping surface; and
a gripper barrier affixed to said support plate that forms a barrier around a point or points where the reticle gripping surface touches the lithographic reticle, wherein said gripper barrier blocks contaminants from the mask and does not contact the lithographic reticle.

19. The reticle gripper barrier system of claim 18, wherein said support plate is affixed to the reticle gripping device.

* * * * *